US000001062H

United States Statutory Invention Registration [19]

[11] Reg. Number: H1062

Umezawa

[43] Published: Jun. 2, 1992

[54] APPARATUS FOR PRODUCING A PRINTING STENCIL PLATE FOR SCREEN PRINTING

[75] Inventor: Masahiro Umezawa, Saitama, Japan

[73] Assignee: Process Lab. Micron Co., Ltd., Kawagoe, Japan

[21] Appl. No.: 540,402

[22] Filed: Jun. 19, 1990

Related U.S. Application Data

[63] Continuation of Ser. No. 186,093, Apr. 22, 1988, abandoned.

[30] Foreign Application Priority Data

May 29, 1987 [JP] Japan ..... 62-82927

[51] Int. Cl.[5] ..... B44C 7/06

[52] U.S. Cl. ..... 156/574

[58] Field of Search ..... 101/128.21, 128.4; 118/108, 112, 77, 118, 119, 209, 253; 156/60, 230, 231, 246, 298, 299, 300, 303, 552, 555, 422, 566, 568, 574; 430/300, 302, 308

[56] References Cited

U.S. PATENT DOCUMENTS

| | | | |
|---|---|---|---|
| 2,842,473 | 7/1958 | Oberly et al. | 156/246 |
| 3,330,713 | 7/1967 | Watson et al. | 156/298 |
| 3,713,935 | 1/1973 | Grecchi | 156/231 |
| 3,975,226 | 8/1976 | Boettcher | 156/495 |
| 4,076,535 | 2/1978 | Vander Putten | 430/308 X |
| 4,098,636 | 7/1978 | Gabriel | 156/298 |
| 4,564,589 | 1/1986 | Hallman et al. | 430/271 X |
| 4,668,329 | 5/1987 | Shirataki | 156/241 |

FOREIGN PATENT DOCUMENTS

| | | | |
|---|---|---|---|
| 2409622 | 9/1974 | Fed. Rep. of Germany | 156/574 |
| 61-114244 | 3/1986 | Japan . | |

*Primary Examiner*—Richard D. Lovering
*Assistant Examiner*—Joseph D. Anthony
*Attorney, Agent, or Firm*—Browdy & Neimark

[57] ABSTRACT

An apparatus for sticking onto a screen plate a photosensitive laminated film obtained by forming a layer of a photosensitive agent on one surface of a base film, wherein a blade is provided on the front side of rollers that hold the photosensitive laminated film to press-adhere said photosensitive laminated film onto the screen plate. The tip of the blade presses the photosensitive laminated film onto the screen plate such that an angle is defined between the photosensitive laminated film and the screen plate to get rid of the air. Therefore, no bubbles are trapped therebetween.

2 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

APPARATUS FOR PRODUCING A PRINTING STENCIL PLATE FOR SCREEN PRINTING

This application is a continuation of application Ser. No. 07/186,093, filed Apr. 22, 1988, now abandoned.

BACKGROUND OF THE INVENTION

1. Field of the Invention

This invention relates to an apparatus for producing a printing stencil plate for screen printing, and more specifically to an apparatus for sticking onto a screen plate a photosensitive laminated film obtained by forming a layer of a photosensitive agent on one surface of a base film.

2. Description of the Prior Art

A direct method and a direct/indirect method for producing a printing stencil plate (hereinafter simply referred to as "PS plate") for screen printing have been known. According to the former method, a photosensitive emulsion is applied onto the screen plate using a bucket squeegee followed by drying thereof The application and drying are repeated until a required thickness is obtained, in order to produce the PS plate.

The latter direct/indirect method can be divided into a water mounting direct/indirect method in which a layer of photosensitive agent on the photosensitive laminated film is swollen with water and is press-adhered onto a screen plate to produce the PS plate, and an emulsion mounting direct/indirect method in which a photosensitive laminated film and a screen plate are stuck together via a photosensitive agent of the film of the direct/indirect method and an emulsion of the same or a similar composition (hereinafter referred to as "mounting emulsion") to produce the PS plate.

With the water mounting direct/indirect method, however, the photosensitive agent of the photosensitive laminated film that is swollen is not applied to the back surface of the screen plate; i.e., the photosensitive laminated film is simply placed on one surface of the screen plate and exhibits poor resistance against the printing. With the emulsion mounting direct/indirect method, on the other hand, the mounting emulsion is applied even to the back surface of the screen plate. However, bubbles are easily introduced into the interface between the mounting emulsion and the photosensitive laminated film which deteriorates the adhesiveness as well as the resolving power.

To preclude such defects, it has heretofore been attempted to lower the viscosity of the mounting emulsion as done by the invention of, for example, Japanese Patent Laid-Open No. 114244/1986. When the solid content of the mounting emulsion is reduced to decrease the viscosity, however, the volume of the mounting emulsion greatly decreases after drying and the resistance against the printing is not much improved.

SUMMARY OF THE INVENTION

It has therefore been desired to provide a method of sticking a photosensitive laminated film onto the screen plate by using a mounting emulsion having a viscosity nearly the same as that of the emulsion that is used in the direct method without permitting the infiltration of bubbles. The present invention satisfies such a demand and its object is to provide an apparatus for reliably and easily sticking the emulsion without decreasing the viscosity of the mounting emulsion and without permitting the infiltration of bubbles.

Another object of this invention is to provide an apparatus which improves the adhesiveness between the photosensitive laminated film and the screen plate and which further helps improve the resolving power.

BRIEF DESCRIPTION OF THE DRAWINGS

Other and further objects, features and advantages of the invention will appear more fully from the following description, described by way of example with reference to the following drawings, in which.

DESCRIPTION OF THE PREFERRED EMBODIMENTS

Figure 1:
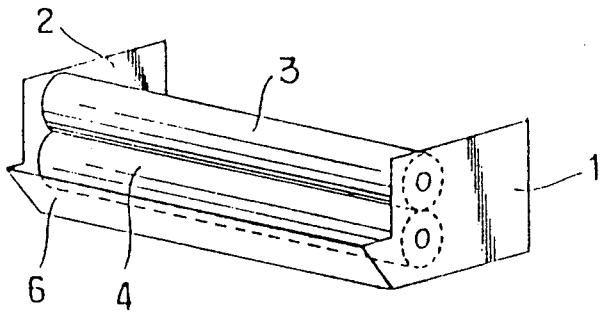
FIG. 1 is a perspective view illustrating an embodiment of the present invention.

Embodiments of the invention will now be described in conjunction with the drawings wherein reference numerals 1 and 2 denote side boards for supporting a pair of rollers 3 and 4. A bottom board 5 that couples the side boards 1 and 2 together extends forward to form a blade 6. The blade 6 may be upwardly folded at an incline as shown. The rollers 3 and 4 hold the photosensitive laminated film 7 sandwiched therebetween.

Figure 4:
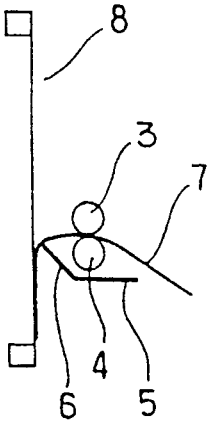
FIG. 3 and 4 are side views showing the state where the apparatus is being used.
Figure 2:
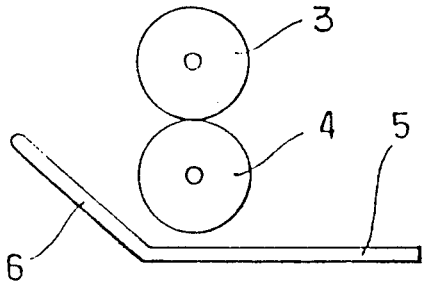
FIG. 2 is a side view of the present invention when the side boards are removed.
Figure 5:
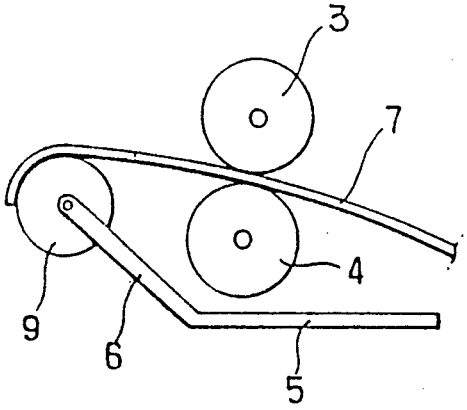
FIG. 5 is a side view showing another embodiment and from which the side boards have been removed.
Figure 3:
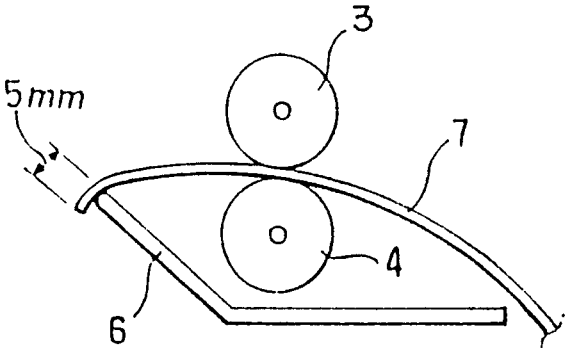

To use the apparatus, first, the film 7 is so set that its tip is about 5 mm ahead of the blade 6 as shown in FIG. 3. Next, the tip of the film 7 that is set to the apparatus as mentioned above is pressed onto a screen plate 8 to which the mounting emulsion has been applied by a known means and which has not yet been dried. Then a portion of the film 7 which is about 5 mm ahead of the blade 6 is swollen with the sticking agent and adheres thereto. Here, if the apparatus is upwardly shifted while being pressed onto the screen plate 8, the film 7 is stuck to the screen plate 8 accompanying the movement (FIG. 4). In this case, the rollers 3 and 4 hold the film 7 while the tip of the blade 6 pushes the film 7 in a manner to define an angle that is suited for eliminating the air between the film 7 and the screen plate 8. Therefore, bubbles are not trapped therebetween, and the adhesiveness increases between the screen plate 8 and the film 7 contributing to increasing the resolving power. As shown in Fig. 5, furthermore, a pressing roller 9 may be provided at the upper end of the blade 6. Even in this case, the apparatus operates in the same manner as described above.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

What is claimed is:

1. An apparatus for producing a printing stencil plate for screen printing comprising:

a pair of rollers disposed so as to receive a photosensitive laminated film passing in a predetermined direction therebetween and to feed the film; and a blade extending upwardly and disposed at a front side of the rollers with respect to the direction of the film for pressing the film onto a screen plate to form an angle, the angle of the blade being so defined that trapping of air between the film and the plate is eliminated.

2. An apparatus for producing a printing stencil plate for screen printing comprising:

a pair of rollers disposed so as to receive a photosensitive laminated film passing therebetween in a predetermined direction and to feed the film;

a blade extending upwardly and disposed at a front side of the rollers with respect to the direction of the film; and a roller rotatably mounted at an upper end of the blade for pressing the film onto a screen plate while eliminating the trapping of the air bubbles between the film and the plate;

the pair of rollers being supported by side boards coupled together by a bottom board;

said bottom board extending forward to form said blade.

* * * * *